United States Patent [19]

Hascoe

[11] 4,232,814
[45] Nov. 11, 1980

[54] METHOD AND APPARATUS FOR FABRICATING A SEALING COVER UNIT FOR A CONTAINER FOR A SEMICONDUCTOR DEVICE

[75] Inventor: Norman Hascoe, Larchmont, N.Y.
[73] Assignee: Semi-Alloys, Inc., Mount Vernon, N.Y.
[21] Appl. No.: 48,365
[22] Filed: Jun. 14, 1979

Related U.S. Application Data

[62] Division of Ser. No. 5,790, Jan. 23, 1979, Pat. No. 4,190,176.

[51] Int. Cl.³ ............................................. B23K 9/225
[52] U.S. Cl. ............................ 228/173 E; 140/92.2; 219/56; 219/87; 242/7.19
[58] Field of Search ................ 228/173 E; 219/56, 58, 219/87; 140/92.2; 242/7.13, 7.19

[56] References Cited

U.S. PATENT DOCUMENTS

| | | | |
|---|---|---|---|
| 1,993,970 | 3/1935 | MacMurray | 140/92.2 X |
| 2,262,455 | 11/1941 | Goodloe | 219/58 X |
| 3,125,133 | 3/1964 | Klingensmith et al. | 140/92.2 |
| 3,823,468 | 7/1974 | Hascoe | 219/87 X |
| 4,192,433 | 3/1980 | Hascoe | 220/200 |

Primary Examiner—Kenneth J. Ramsey
Attorney, Agent, or Firm—Laurence B. Dodds

[57] ABSTRACT

A cover unit for hermetically sealing a container for a semiconductor device comprises a rectangular metallic cover element such as a cobalt-nickel-iron alloy and a plurality of contiguous turns of wire of a heat-fusible material such as a gold-tin eutectic alloy formed and disposed on the cover element with the outermost turn substantially in registry with the periphery thereof, said turns being spot-welded thereto substantially at the corners of the cover element. The preferred method of fabricating the foregoing hermetic sealing cover unit comprises disposing it in a shallow cavity of a rotatable nonconductive supporting member, such cavity having dimensions to retain the cover element in desired position and forming a flat single-layer multiturn wire winding of heat-fusible material by winding it on a mandrel in contact with the cover element and rotatable therewith and spot-welding the winding to the cover element at a plurality of spaced points. An apparatus for performing the foregoing method comprises a rotatable nonconductive supporting member having a shallow cavity for receiving and closely fitting a cover element, a mandrel rotatable with and engaging the supporting element and having an annular recess proportioned to receive a single-layer multiturn wire winding and having an extending supporting shaft, means for rotating the supporting member and the mandrel together with means for feeding wire to the mandrel to form such single-layer multiturn winding. The apparatus also includes a nonrotatable electrode assembly disposed about the shaft and normally disengaging the cover element but movable axially of its shaft to spot-weld the multiturn winding to the cover element.

5 Claims, 4 Drawing Figures

4,232,814

METHOD AND APPARATUS FOR FABRICATING A SEALING COVER UNIT FOR A CONTAINER FOR A SEMICONDUCTOR DEVICE

CROSS-REFERENCE TO RELATED APPLICATION

This application is a division of pending application Ser. No. 005,790, filed Jan. 23, 1979, and entitled "Sealing Cover Unit for a Container for a Semiconductor Device and a Method and Apparatus for Fabricating the Same", now U.S. Pat. No. 4,190,176, issued on Feb. 26, 1980.

BACKGROUND OF THE INVENTION

1. Field of the Invention

The sealing cover unit fabricated in accordance with the method of the present invention is of particular utility in hermetically sealing a container for a semiconductor device such as an integrated circuit which must be protected from exposure to ambient atmosphere.

2. Description of the Prior Art

In the manufacture of semiconductor devices, there has been a requirement for hermetically sealing the container in which the active semiconductor device is housed, usually a cavity in a metallic or ceramic body. For this purpose, a metallic cover and a solder preform ring have been used. Initially, the metallic cover and the solder preform ring were assembled separately and disposed on a sealing ring of a container and the assembly was heated to solder the cover to the container and hermetically seal the container.

In accordance with current general practice, the solder preform ring is preattached to the sealing cover and the resulting unit disposed over the container of the semiconductor device and heated to fuse the solder preform to the cover and to the container as described and claimed in applicant's U.S. Pat. Nos. 3,823,468 and 3,874,549. Such preattached sealing cover-solder preform units have acquired substantial commercial success since they have several important advantages over the use of separate sealing covers and solder preforms, namely, increasing substantially the hermetic sealing yields, lowering assembly costs, and alleviating the logistics of keeping balanced inventories of the sealing covers and the solder preforms for various sizes of semiconductor packages.

In the current practice of fabricating the preattached cover element and solder preform, the latter usually has a thickness of 0.001 inch to 0.005 inch and is stamped from a continuous solder ribbon of the desired gold-tin eutectic alloy. As a result, approximately 15% of the ribbon resides in the solder preform and 85% becomes scrap in the form of a skeleton and the center punched-out sections. Ordinarily, the gold or other precious or semiprecious metals in the scrap are recycled by melting, adjusting the alloy content to the required ratio, recasting, rolling and reusing for manufacturing additional solder preforms. Often, the alloy becomes unusable for recycling because of the accumulation of foreign materials. The solder must then be refined into its various pure metal components. A so-called virgin melt must then be made from the refined metals.

Such recycling and refining operations entail appreciable labor, material, and energy costs. Some of the precious metal is necessarily lost in the refining and remelting steps of manufacture and this adds additional cost. A substantial economic disadvantage of obtaining such a low yield of the solder ribbon in the finished solder preform is the requirement that an excessive amount of precious metal—usually gold—must be tied up in inventory and work in process. The interest costs on the excessive amount of precious metal that must be purchased are substantial.

It is an object of the invention to provide an improved method and apparatus for fabricating a novel sealing cover-solder preform unit.

SUMMARY OF THE INVENTION

In accordance with the invention, the method of fabricating an hermetic sealing cover unit for a container for a semiconductor device and including a metallic cover element comprises forming a flat single-layer multiturn wire winding of heat-fusible material in situ on the cover element, the periphery of the winding being substantially in registry with the periphery of the cover element, and fusing the winding to the cover element at a plurality of spaced points.

Further in accordance with the invention, an apparatus for fabricating a sealing cover unit for a container for a semiconductor device which includes a metallic cover element and a rotatable nonconductive supporting member having a shallow cavity for receiving and closely fitting a cover element, a mandrel rotatable with and engaging the supporting element and having an annular recess proportioned to receive a single-layer multiturn heat-fusible wire winding, means for rotating the supporting member and the mandrel together and for feeding the wire to the mandrel to form the single-layer multiturn winding.

For a better understanding of the present invention, together with other and further objects thereof, reference is had to the following description, taken in connection with the accompanying drawings, while its scope will be pointed out in the appended claims.

BRIEF DESCRIPTION OF THE DRAWINGS

FIG. 2A is a perspective view of the electrode assembly of FIG. 2; while

DESCRIPTION OF THE PREFERRED EMBODIMENT

Figure 1:
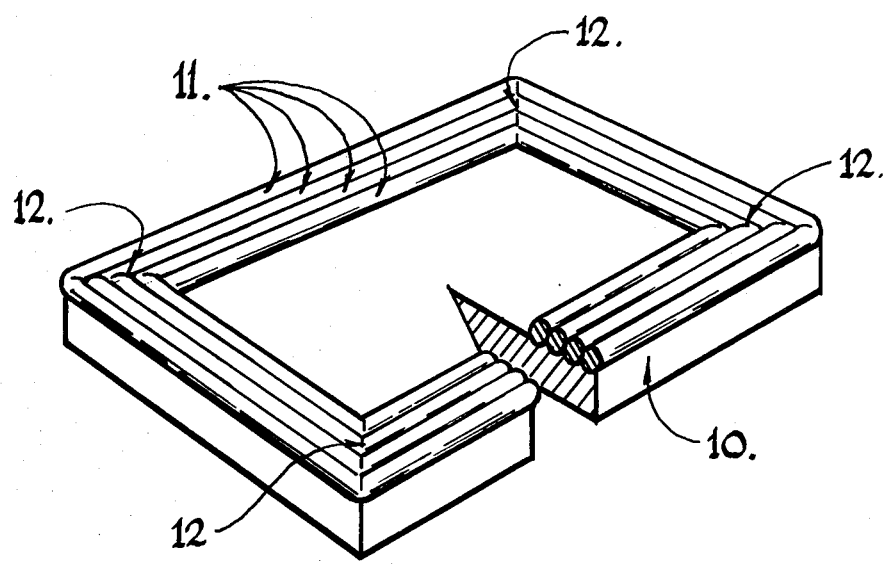
FIG. 1 is a perspective view, partly in section, of a sealing cover unit for a container for a semiconductor device fabricated in accordance with the method of the invention.

Referring now to FIG. 1 of the drawings, there is shown a cover unit for hermetically sealing a container for a semiconductor device which comprises a rectangular cover element 10, preferably of a cobalt-nickel-iron alloy commercially available as KOVAR, and a plurality of contiguous turns of wire 11 of a heat-fusible material, preferably a gold-tin eutectic alloy comprising 80% gold and 20% tin. The turns of wire 11 are formed and disposed on the cover element 10 with their outermost turn substantially in registry with the periphery thereof and the several turns are fused to the cover element 10 at a plurality of spaced points, preferably substantially at the corners as indicated by the dash lines 12. The dimensions of the cover element 10 and the turns of wire 11 are greatly exaggerated for clarity of illustration. While only four turns of wire are shown, in practice it has been found preferable to provide approximately 20 turns of wire 11 of about 0.00225 inch diameter while the cover element 10 is ordinarily of a thickness of about 0.010 inch.

Figure 2A:
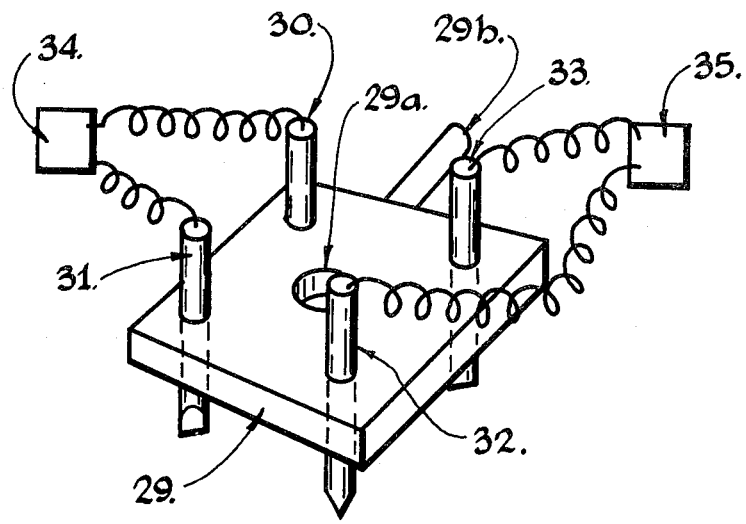
Figure 2B:
FIG. 2B comprises side and front views of one of the electrodes of the electrode assembly of FIG. 2A.
Figure 2:
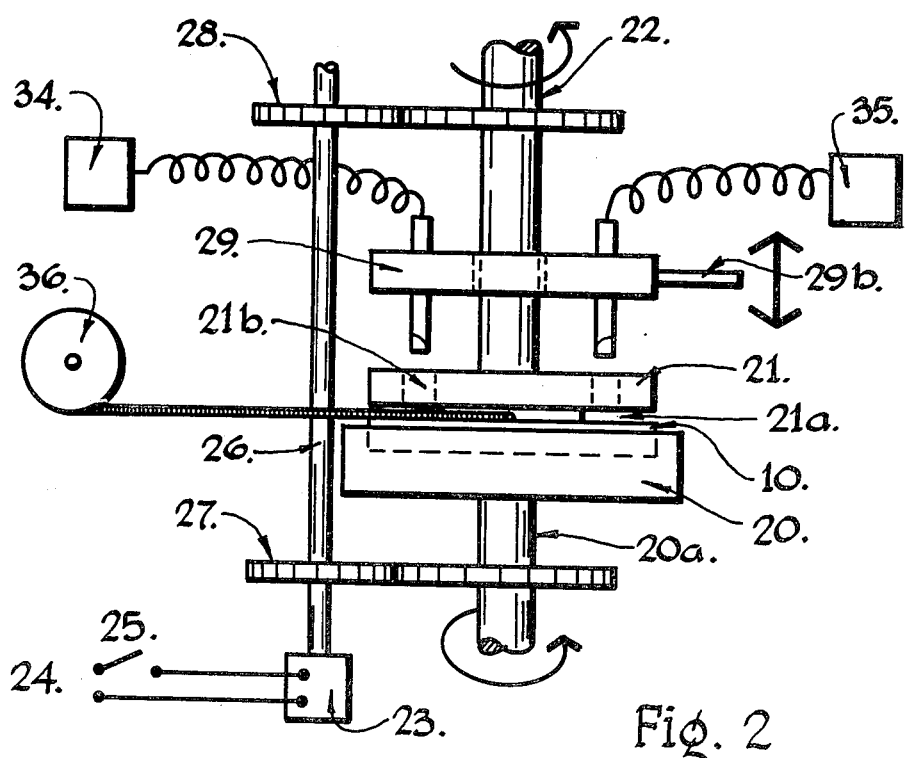
FIG. 2 is a schematic view of an apparatus for fabricating the hermetic sealing cover unit of FIG. 1.

The apparatus for fabricating the sealing cover unit of FIG. 1 is shown in FIG. 2 and comprises a rotatable nonconductive supporting member 20 mounted on a shaft 20a having a shallow cavity for receiving and closely fitting the cover element 10. The apparatus also includes a mandrel 21 rotatable with and engaging the cover element 10 in the recess of the supporting member 20 and having an annular recess 21a proportioned to receive a single-layer multiturn heat-fusible wire winding. The mandrel 21 has an extending supporting shaft 22. The supporting member 20 and the mandrel shaft 22 are rotated in unison by a motor 23 energized from supply terminals 24 through a switch 25. The motor 23 drives a shaft 26 which, in turn, drives the rotatable supporting member 20 through gearing 27 and the mandrel shaft 22 through gearing 28.

The apparatus further includes a nonrotatable electrode assembly 29 shown in detailed perspective in FIG. 2A. This assembly includes a central hole 29a through which the shaft 22 projects and a handle 29b for raising or lowering the assembly. At the corners of the assembly 29 are secured electrodes 30, 31, 32, and 33, the electrodes 30 and 31 being connected in series with a direct-current source 34 and the electrodes 32 and 33 being connected in series with a direct-current source 35. Each of the electrodes 30–33 is chiselshaped as shown in the side and front views of FIG. 2B. The electrode assembly 29 normally disengages the rotating elements 20 and 21 but the mandrel 21 has, at each corner, a hole 21b for receiving one of the electrodes 30–33 of the electrode assembly after the completion of the winding of the multiturn winding and after the support 20 and mandrel 21 have come to rest.

Briefly, in the operation of the apparatus of FIG. 2, wire from a spool 36 is attached to a point of the mandrel 21 and the switch 25 is closed to rotate the support 20 and the mandrel 21, forming a single layer of wire winding in the recess 21a of mandrel 21. The wire is continuously wound on the mandrel 21 until the periphery of the winding is substantially in registry with the periphery of the cover, as shown in FIG. 1. When the winding is completed and the wire from the spool 36 severed, the mandrel 21 and supporting member 20 are adjusted until the electrodes 30–33 of the electrode assembly 29 register with the holes 21b of the mandrel and the electrode assembly 29 is lowered so that the chisel-like welding electrodes 30–33 engage the winding thus formed and spot-weld each of the turns thereof to the cover element 10 substantially at the corners of the cover element 10, as shown by the dash lines 12 of FIG. 1.

As stated above, the preferred material for the wire turns 11 is a gold-tin eutectic alloy comprising 80% gold and 20% tin by weight. This alloy is very brittle. In order to make practical its fabrication, the wire must be formed and wound approximately 15° C. to 40° C. below the melting point of the gold-tin eutectic alloy which is about 280° C. Other solder alloys which are not brittle do not have the requirement of being fabricated at an elevated temperature.

Coming back to the dimensions of the cover element 10 and the wire turns 11, the cover element 10 preferably is of a thickness of about 0.010 inch while the thickness T of the solder ring formed by the fusing of the wire turns 11 in the final hermetic sealing operation is desirably about 0.002 inch. In order to achieve this desired final thickness T, the diameter of the round wire of turns 11 must be $2T/\sqrt{\pi}$ or $1.128T$; that is, about 0.00225 inch. Obviously, if a wire of square cross-section is utilized, its thickness will be the same as the desired ultimate thickness of the solder ring.

While there has been described what is, at present, considered to be the preferred embodiment of the invention, it will be obvious to those skilled in the art that various changes and modifications may be made therein, without departing from the invention, and it is, therefore, aimed in the appended claims to cover all such changes and modifications as fall within the true spirit and scope of the invention.

What is claimed is:

1. The method of fabricating an hermetic sealing cover unit for a container for a semiconductor device and including a metallic cover element comprising:
    forming a flat single-layer multiturn wire winding of heat-fusible material in situ on the cover element, the periphery of said winding being substantially in registry with the periphery of the cover element;
    and fusing said winding to said cover element at a plurality of space points.

2. The method of fabricating an hermetic sealing cover unit in accordance with claim 1 in which the cover element is disposed in a shallow cavity of a rotatable nonconductive supporting member, said cavity having dimensions to retain said cover element in desired position and in which said multiturn winding is wound on a mandrel in contact with said cover element and rotatable therewith.

3. The method of fabricating an hermetic sealing cover unit in accordance with claim 1 in which the fusing of said winding to said cover element is by spot-welding.

4. Apparatus for fabricating a sealing cover unit for a container for a semiconductor device which includes a metallic cover element and
    a rotatable nonconductive supporting member having a radial end face including a shallow cavity for receiving and closely fitting a cover element;
    a mandrel rotatable with and adapted to engage a cover element disposed on said supporting element and having an annular recess proportioned to receive a single-layer multiturn heat-fusible wire winding;
    means for rotating said supporting member and said mandrel together and for feeding said wire to said mandrel to form said single-layer multiturn winding juxtaposed to said cover element.

5. A fabricating apparatus in accordance with claim 4 in which said rotatable mandrel has an extending supporting shaft and including a nonrotatable electrode assembly disposed about said shaft and normally disengaging the cover element but movable axially of said shaft to spot-weld said multiturn winding to the cover element.

* * * * *